(12) United States Patent
Hirano et al.

(10) Patent No.: US 6,307,324 B1
(45) Date of Patent: Oct. 23, 2001

(54) DISPLAY APPARATUS USING ELECTROLUMINESCENCE ELEMENTS

(75) Inventors: Kiichi Hirano, Gifu-ken; Naoaki Komiya, Ohgaki, both of (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/047,752

(22) Filed: Mar. 25, 1998

(30) Foreign Application Priority Data

Mar. 27, 1997 (JP) .................................................. 9-076086

(51) Int. Cl.[7] ...................................................... G05G 5/00
(52) U.S. Cl. ........................... 315/169.3; 345/76; 345/205
(58) Field of Search .................... 428/690, 917; 315/169.3; 313/505, 506; 257/89; 345/205, 76

(56) References Cited

U.S. PATENT DOCUMENTS 3,708,717 * 1/1973 Fleming .............................. 313/169
6,084,579 * 7/2000 Hirano ................................ 345/205

* cited by examiner

*Primary Examiner*—David Vu
(74) *Attorney, Agent, or Firm*—Sheridan Ross P.C.

(57) ABSTRACT

In an active matrix system, a pixel of a display apparatus includes an electroluminescence (EL) element, a diode type driving element connected in series to the EL element for driving the EL element, an added capacitor and an added resistor. The added resistor is connected in series with the added capacitor, and the added resistor and the added capacitor are connected in parallel to the EL element. The added capacitor improves a writing characteristic and a holding characteristic of the pixel, such that a high quality image can be displayed.

22 Claims, 5 Drawing Sheets

DISPLAY APPARATUS USING ELECTROLUMINESCENCE ELEMENTS

BACKGROUND OF THE INVENTION

The present invention relates to a display apparatus using electroluminescence elements.

Electroluminescence (EL) elements for use in a display apparatus include an inorganic EL element and an organic EL element. The inorganic EL element uses a thin film of an inorganic compound, like zinc selenide or zinc sulfide, as a fluorescent material, and the organic EL element uses an organic compound as a fluorescent material. Preferably, the organic EL element has the following features:

(1) A high external quantum efficiency.
(2) Light is emitted on a low driving voltage.
(3) Multifarious colors (green, red, blue, yellow, etc.) can be generated by selecting a proper fluorescent material.
(4) The display is clear and no back light is needed.
(5) There is no dependency on the viewing angle.
(6) The organic EL element is thin and light.
(7) A soft material like a plastic film can be used for the substrate.

Due to the aforementioned features, a display apparatus using such an organic EL element (hereinafter referred to as "organic EL display apparatus") is a desirable replacement for a CRT or liquid crystal display.

An organic EL display apparatus employs a dot matrix system which displays an image with dots arranged in a matrix form. The dot matrix system includes a simple matrix system or an active matrix system.

A conventional organic EL display apparatus 101 of the simple matrix system will now be discussed with reference to FIGS. 1 through 3.

As shown in FIG. 1, a plurality of anodes 103 are arranged, parallel to one another, on an insulator substrate 102, and a hole transporting layer 104 is provided on the insulator substrate 102 to cover the anodes 103. A light emitting layer 105 and an electron transporting layer 106 are formed on the hole transporting layer 104. A plurality of cathodes 107 are arranged, parallel to one another, on the electron transporting layer 106. The anodes 103 are placed perpendicular to the cathodes 107. The layers 104–106 are formed of an organic compound, and the layers 104–106, the anodes 103 and the cathodes 107 form an organic EL element 108. The insulator substrate 102 is preferably made of transparent glass, synthetic resin or the like. The anodes 103 are preferably formed of transparent electrodes of ITO (Indium Tin Oxide) or the like. The cathodes 107 are preferably formed of magnesium-indium alloy or the like.

In the organic EL element 108, holes coming from the anodes 103 are recombined with electrons coming from the cathodes 107 inside the light emitting layer 105, emitting light. The light is emitted outside via the anodes 103 and the transparent insulator substrate 102 as indicated by the arrow gamma ($\gamma$) in FIG. 2.

The hole transporting layer 104 facilitates the injection of the holes from the anodes 103, and also blocks the electrons injected from the cathodes 107. The electron transporting layer 106 facilitates the injection of the electrons from the cathodes 107. The organic EL element 108 has a high external quantum efficiency, resulting in the display apparatus 101 having an improved luminous intensity.

FIG. 3 is a schematic plan view of the organic EL display apparatus 101, as viewed from the anodes 103. In FIG. 3, only the anodes 103 and the cathodes 107 are illustrated. In the organic EL element 108, defined at the individual intersections of anodes 103a to 103c and cathodes 107a to 107c are light emitting areas B1 to B9 which emit light, as discussed above. That is, the light emitting areas B1–B9, arranged in a matrix form, form pixels of the organic EL display apparatus 101.

In a simple matrix system, the positive terminal of a driving power supply is connected to the anodes 103, and the negative terminal of the driving power supply is connected to the cathodes 107. In this manner, the anodes 103 and the cathodes 107 are energized.

In order for the light emitting area B2 at the intersection of the anode 103b and the cathode 107a to emit light, for example, the positive terminal is connected to the anode 103b and the negative terminal is connected to the cathode 107a, so that power is supplied through the terminals. As a result, a forward current flows, as indicated by the arrow alpha ($\alpha$)When energizing the light emitting area B2, a leak current may flow, as indicated by the arrow beta ($\beta$). The leak current energizes not only the light emitting area B2, but also the light emitting areas B1, B3 and B5 near the light emitting area B2. As a result, the light emitting areas B1, B3 and B5 emit light. This phenomenon is called optical crosstalk caused by the leak current characteristic of the EL element 108.

The light produced by the light emitting layer 105 can be scattered. As indicated by the arrow delta ($\delta$) in FIG. 2, the light from the light emitting layer 105 is reflected at the electron transporting layer 106 and can be discharged outside from an unnecessary location. Further, the light from the light emitting layer 105 can be discharged outside from an unnecessary location without passing the anodes 103 as indicated by the arrow epsilon ($\epsilon$) in FIG. 2. As indicated by the arrow eta ($\eta$) in FIG. 2, the light from the light emitting layer 105 is optically guided by the optical waveguide effect resulting from the difference in refractive index between the light emitting layer 105 and the hole transporting layer 104, and can be discharged outside from an unnecessary place. This light scattering causes light emission at a location other than the desired pixel in the organic EL display apparatus 101. This phenomenon is called the generation of optical crosstalk caused by light scattering that has originated from the structure of the EL element.

The optical crosstalk due to the leak current and the structure of the EL element 108 deteriorates the contrast of images displayed by the organic EL display apparatus 101, preventing the acquisition of high-definition images. Particularly, a full-color organic EL display apparatus using EL elements causes color "smearing" and does not provide clear images.

The simple matrix system directly drives organic EL elements 108 of a matrix of pixels, arranged on a display panel, in synchronism with a scan signal using an external driving unit. Each pixel on the display panel has only an organic EL element. As the number of scan lines of a display apparatus increases, therefore, the driving time (duty) assigned to each pixel decreases. This reduces the contrast as well as the luminance intensity of the display screen.

Accordingly, it is an object of the present invention to provide a display apparatus, using electroluminescence elements, capable of displaying clearimages.

SUMMARY OF THE INVENTION

To achieve the above objetive, the present invention provides a display apparatus of an active matrix system, comprising: electroluminescence elements; diode type driving elements for driving the electroluminescence elements;

and an added capacitor connected in parallel to the electroluminescence elements.

The present invention provides a pixel of a display apparatus in an active matrix system, the pixel comprising: an electroluminescence (EL) element; a diode type driving element connected in series to the EL element for driving the EL element; an added capacitor; and an added resistor connected in series with the added capacitor, wherein the added resistor and the added capacitor are connected in parallel to the EL element.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiment together with the accompanying drawings in which.

DETAILED DESCRIPTION OF THE PREFERRED EMBODIMENTS

Figure 1:
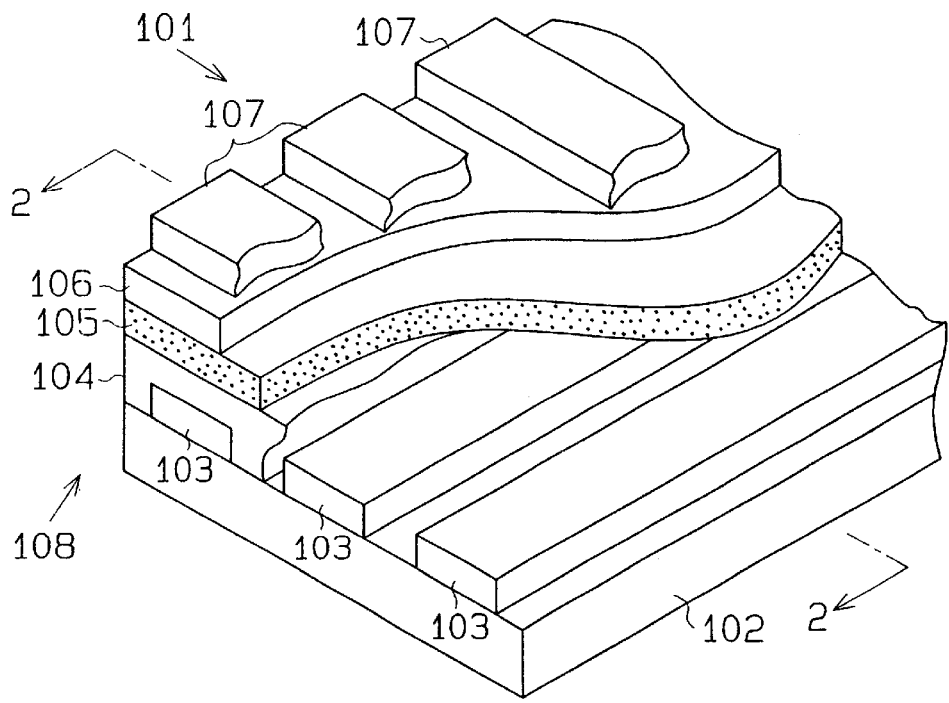
FIG. 1 is a perspective view showing a conventional organic EL display apparatus.
Figure 2:
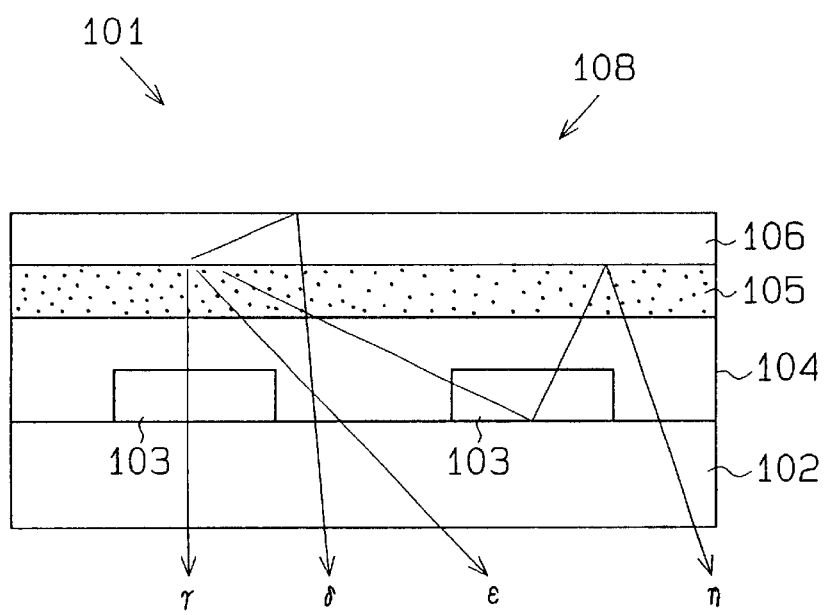
FIG. 2 is a cross-sectional view taken along the line 2–2 in FIG. 1.
Figure 3:
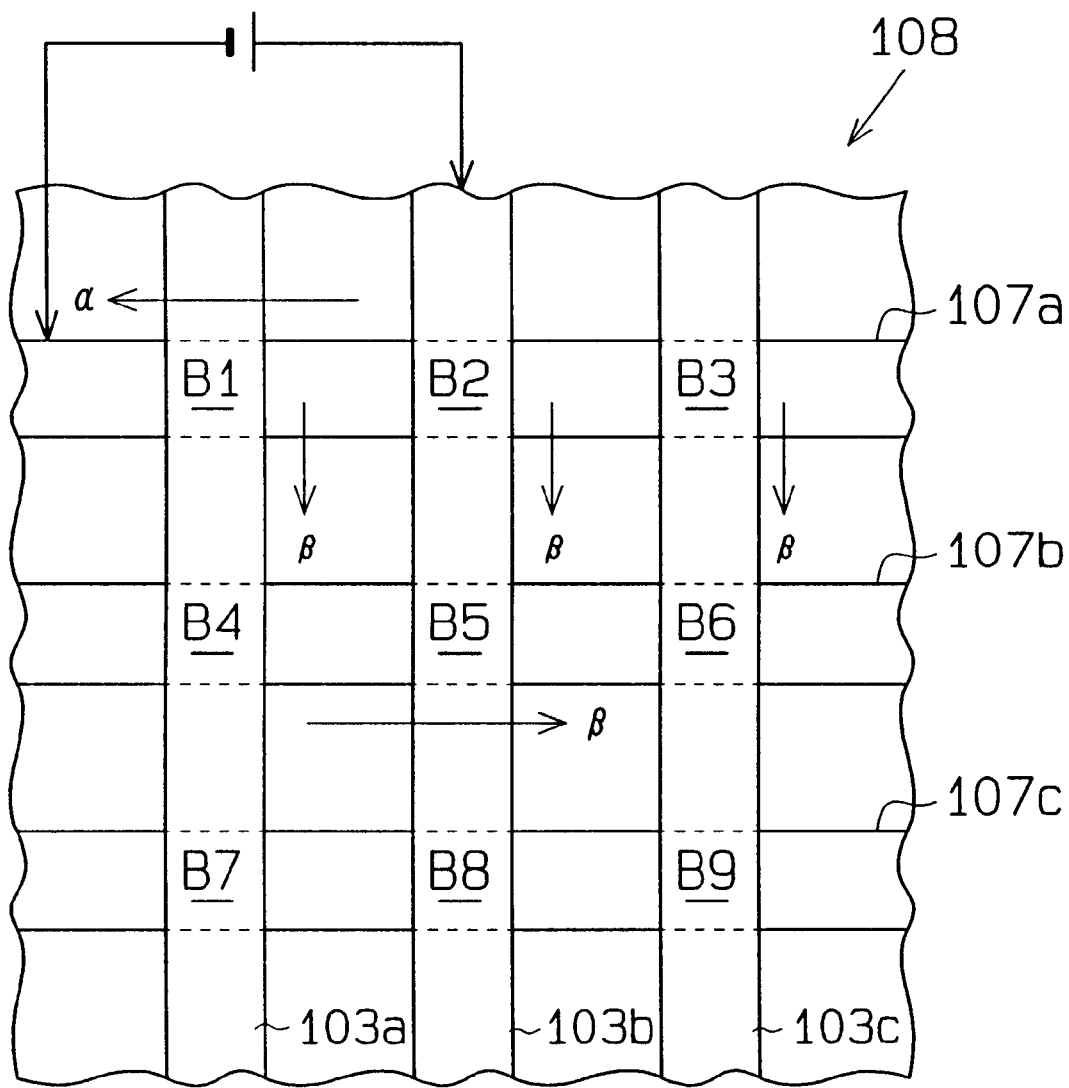
FIG. 3 is a plan view showing only the electrodes of the display apparatus of FIG. 1.
Figure 4:
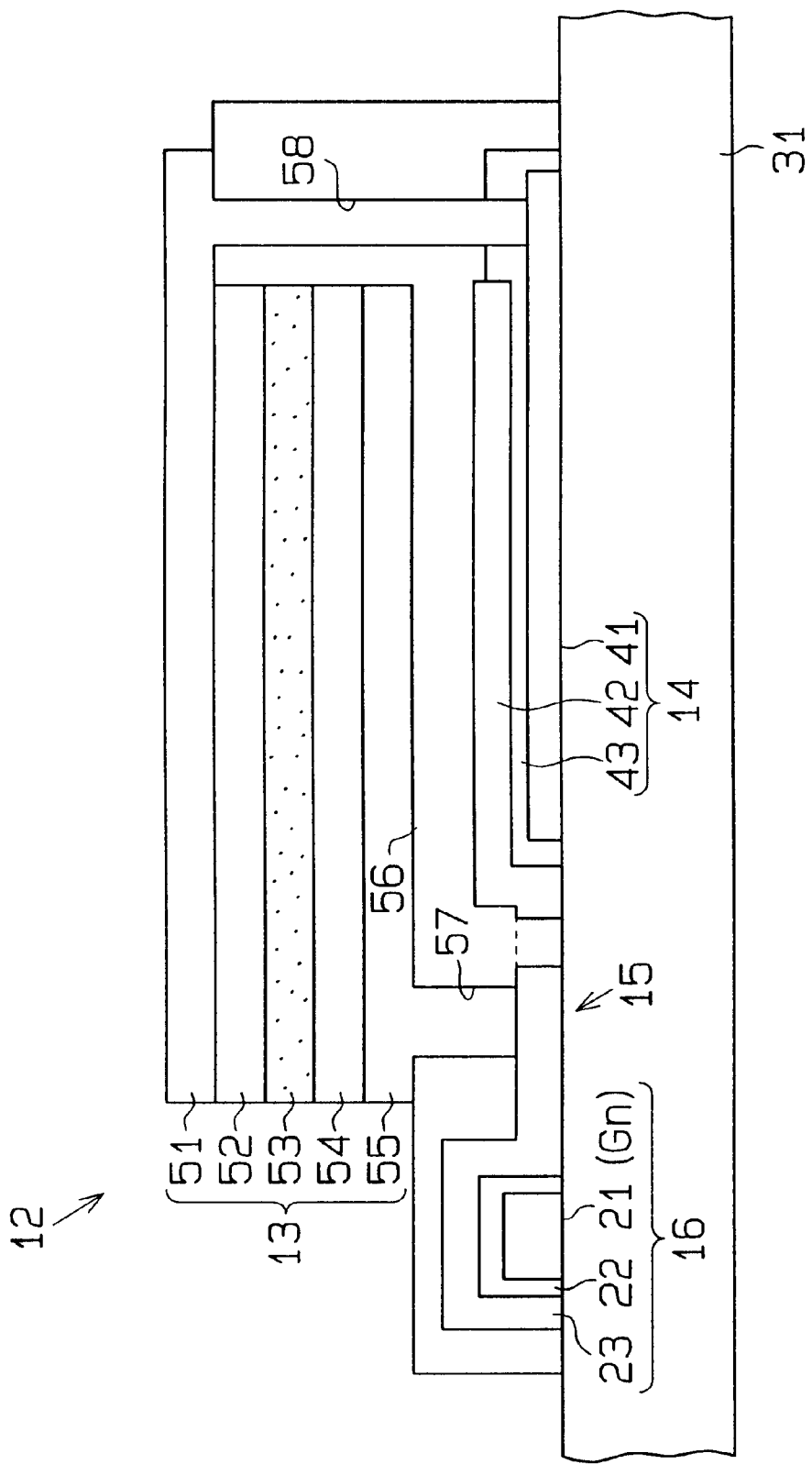
FIG. 4 is a cross-sectional view of an organic EL display apparatus according to the present invention.

An organic EL display apparatus 11 according to one embodiment of the present invention will now be described with reference to FIGS. 4 through 7.

According to the present invention, in the organic EL display apparatus 11 of an active matrix system, one pixel 12 comprises an organic EL element 13, an added capacitor 14, an added resistor 15, and a pixel driving element such as MIM (Metal Insulator Metal) diode 16.

The MIM diode 16, formed on an insulator substrate 31, has a cathode electrode 21, which is preferably a lamination of tantalum, an insulator film 22, preferably of silicon oxide, and an anode electrode 23, preferably of chromium.

The resistor 15 comprises of an interconnection layer formed on the insulator substrate 31 by leading the anode electrode 23 of the MIM diode 16 out on the insulator substrate 31.

The added capacitor 14 includes electrodes 41 and 42 facing each other, and an insulator film 43 disposed between the electrodes 41 and 42. The electrode 41, preferably made of tantalum, is formed on the insulator substrate 31. The insulator film 43, preferably of silicon oxide is formed on the electrode 41. The electrode 42, preferably of chromium, is formed on the insulator film 43. The electrode 42 is connected to the interconnection layer of the resistor 15. The electrode 41 is formed at the same time as the cathode electrode 21 of the MIM diode 16, the electrode 42 is formed at the same time as the anode electrode 23 of the MIM diode 16, and the insulator film 43 is formed at the same time as the insulator film 22 of the MIM diode 16.

The organic EL element 13 has a lamination of an anode 51, formed by a transparent electrode, preferably of ITO, a hole transporting layer 52, a light emitting layer 53, an electron transporting layer 54, and a cathode 55 of preferably an aluminum alloy. The layers 52–54 are formed of organic compounds.

Figure 5:
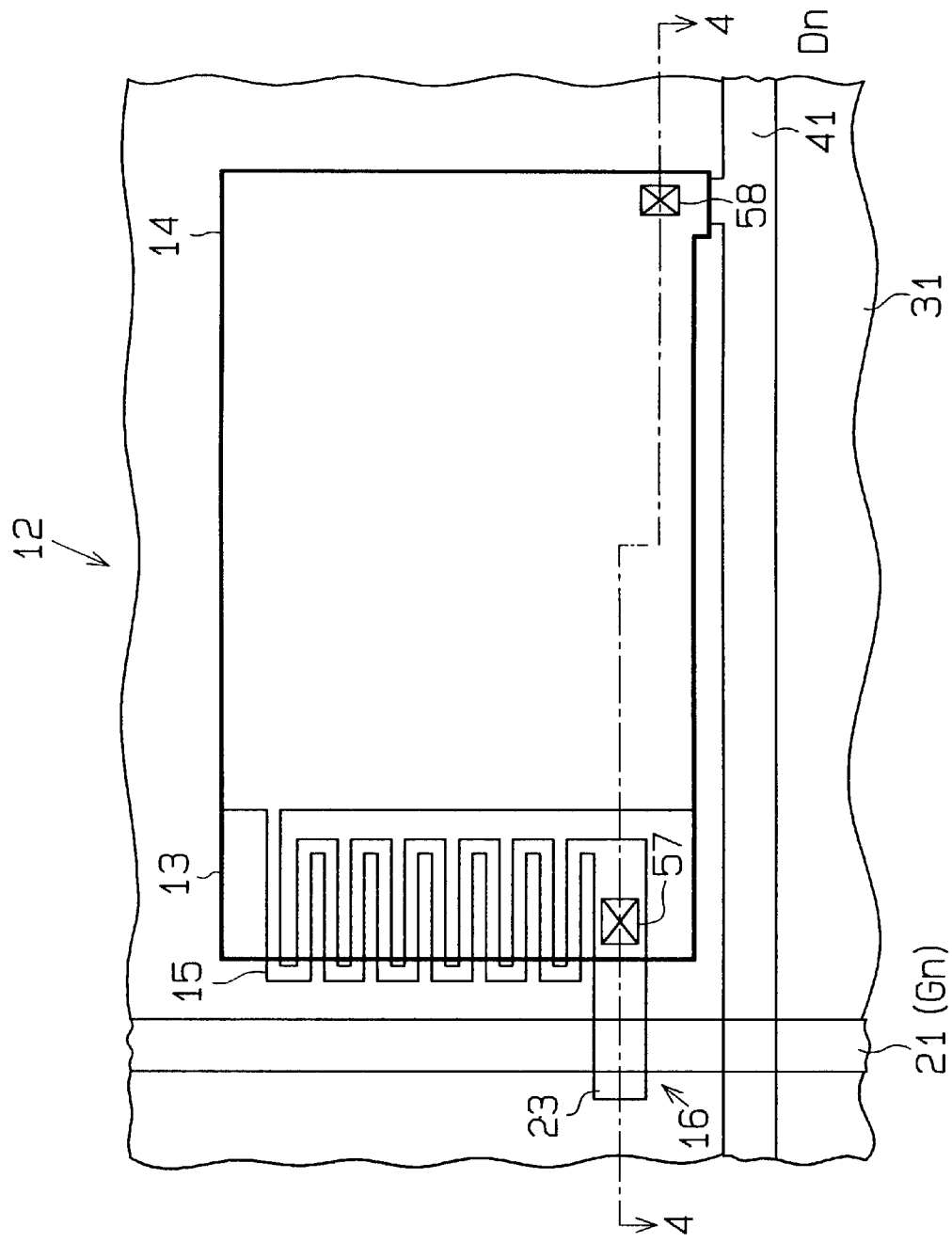
FIG. 5 is a schematic plan view showing the display apparatus of FIG. 4.

An insulator film 56 of silicon oxide is formed on the MIM diode 16 and the capacitor 14. The cathode 55 is preferably formed on the insulator film 56. The cathode 55 is connected to the anode electrode 23 of the MIM diode 16 via a contact hole 57 in the insulator film 56. The anode 51 is connected to the electrode 41 of the capacitor 14 via a contact hole 58 in the insulator films 56 and 43. As shown in FIG. 5, the contact holes 57 and 58 are located at the respective end portions of the pixel 12.

Figure 6:
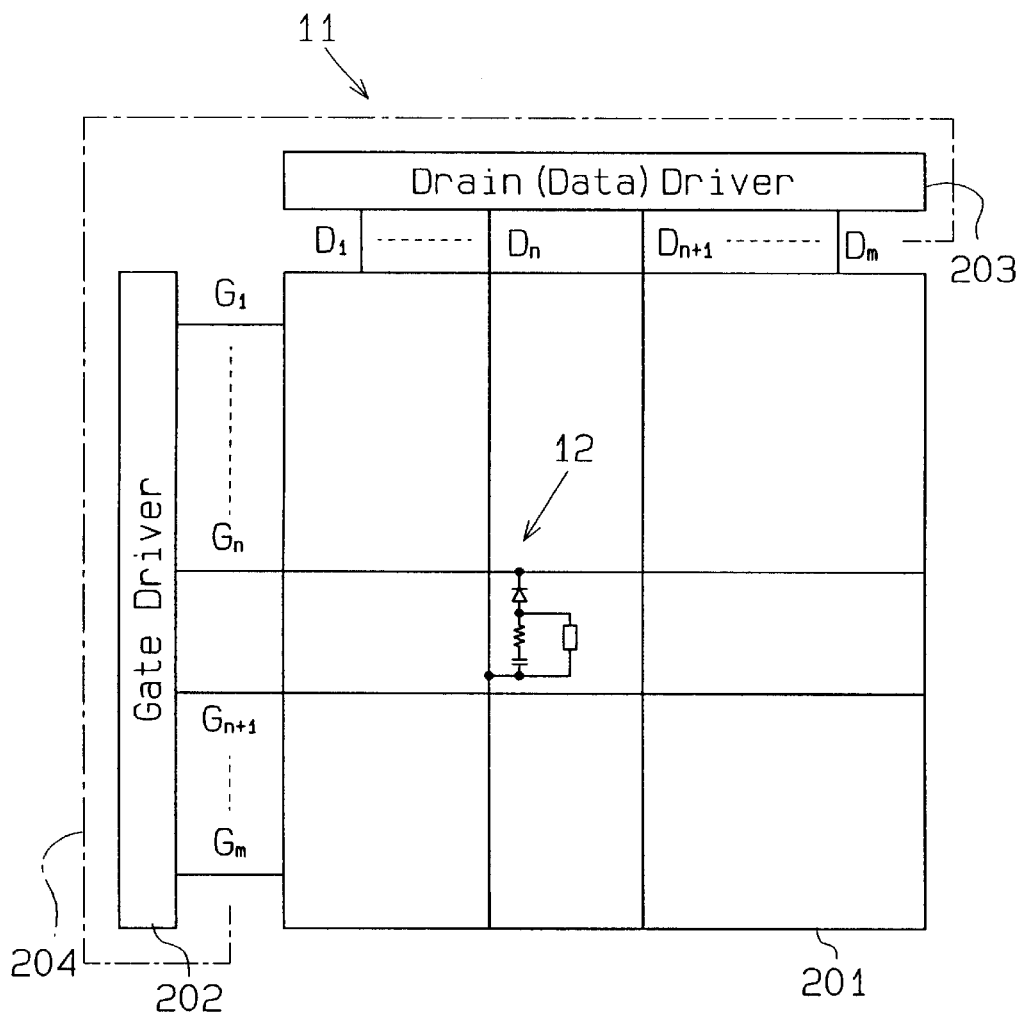
FIG. 6 is a block diagram illustrating the organic EL display apparatus of FIG. 4.

Referring now to FIG. 6, the circuit of the organic EL display apparatus 11 will be described. As shown, the organic EL display apparatus 11 includes a display panel 201, a gate driver 202, and a drain (data) driver 203.

The display panel 201 has a plurality of gate lines (scan lines) G1, . . . , Gn, Gn+1, . . . , and Gm, and a plurality of drain lines (data lines) D1, . . . , Dn, Dn+1, . . . , and Dm. The gate lines G1–Gm perpendicularly cross the respective drain lines D1–Dm, with pixels 12 located at the individual intersections. The pixels 12, arranged in a matrix, form the display panel 201.

The gate driver 202, connected to the individual gate lines G1–Gm, applies a gate signal (scan signal) to the gate lines G1–Gm. The drain driver 203, connected to the individual drain lines D1–Dm, applies a data signal thereto. The drivers 202 and 203 form a peripheral driving circuit 204. Each of the gate lines G1–Gm includes the cathode electrode 21 of the MIM diode 16. Each of the drain lines D1–Dm is comprised of the electrode 41 on the substrate 31.

Figure 7:
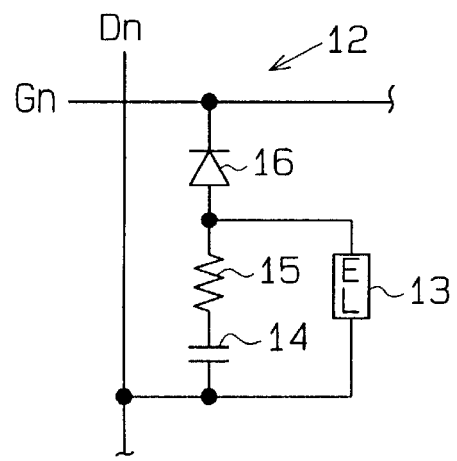
FIG. 7 is a schematic circuit diagram of an equivalent circuit showing a pixel of the organic EL display apparatus of FIG. 6.

FIG. 7 shows an equivalent circuit diagram of the pixel 12. The MIM diode 16, the added resistor 15 and the added capacitor 14 are serially connected in order between the gate line Gn and the drain line Dn. The EL element 13 is connected in parallel to the added resistor 15 and the added capacitor 14.

For each of the pixels 12, the potential difference between the gate lines G1–Gm and drain lines D1–Dm is controlled to drive the EL element 13 by selectively turning-on and turning-off the MIM diode 16.

When a voltage applied to the gate line Gn is controlled to set a voltage between the each line Gn and Dn higher than the threshold voltage for the MIM diode 16, the MIM diode 16 is turned on. As a result, the capacitor of the organic EL element 13 and the added capacitor 14 are charged with a data signal applied to the drain line Dn, so that the data signal is written in the pixel 12. The organic EL element 13 is driven by the data signal.

When the voltage applied to the gate line Gn is controlled to set the voltage between the line Gn and the line Dn less than the threshold voltage for the MIM diode 16, the MIM diode 16 is turned off. At this time, the data signal, applied to the drain line Dn, is held in the form of a charge in the capacitor of the organic EL element 13 and the added capacitor 14. In this manner, an arbitrary data signal is held in each pixel 12 by inputting the data signal to each of the drain lines D1–Dm and controlling the voltage of each of the gate lines G1–Gm. The driving of the organic EL element 13 is maintained by the discharging of the capacitor until the MIM diode 16 is turned on again.

As mentioned previously, when the number of gate lines (scan lines) is increased, the driving time assigned to one pixel 12 becomes shorter. However, since a charge is stored, as discussed above, although the time assigned to each pixel become shorter, light emission is not interrupted, which prevents the contrast of an image on the display panel 201 from decreasing. The organic EL display apparatus 11 of the active matrix system, therefore, ensures higher quality display than the organic EL display apparatus of the simple matrix system.

The important characteristics of the pixel 12 include the writing characteristic and the holding characteristic. What is required in the writing characteristic is whether a desired data signal can be sufficiently written in the organic EL element 13 of each pixel 12 within a predetermined time. What is required in the holding characteristic is whether the data signal, once written in the organic EL element 13 of each pixel 12, can be held for a predetermined time. The time needed for data writing and the data holding time are set in accordance with the specifications of the display panel 201.

As the organic EL element 13 is connected in parallel to the added resistor 15 and the added capacitor 14, the writing characteristic and the holding characteristic of the pixel 12 are improved by the capacitance of the added capacitor 14. Accordingly, the organic EL display apparatus 11 of the active matrix system has a high image quality.

The added resistor 15 is provided because the internal resistor of the organic EL element 13 is small. Without the resistor 15, the holding characteristic of the pixel 12 is decreased. Because the time constant that is determined by the internal resistor of the organic EL element 13 and the added capacitor 14 is small, the time for the pixel 12 to be able to hold a data signal is not long enough. In this respect, the added resistor 15 is provided to improve the data holding characteristic of the pixel 12. To acquire the required data holding characteristic, the resistance of the resistor 15 is properly set by changing the amount of dose of an impurity in the interconnection layer or designing the interconnection layer to have a predetermined, long length.

As the organic EL element 13 and the added capacitor 14 have lamination structures, the occupying area of the pixel 12 on the insulator substrate 31 (the display panel 201) does not increase.

It should be apparent to those skilled in the art that the present invention may be embodied in many other specific forms without departing from the spirit or scope of the invention. Particularly, it should be understood that the invention may be embodied in the following forms.

(1) Instead of the above structure, the organic EL element 13 and the added capacitor 14 may be arranged in the reverse order. That is, the organic EL element 13 and the capacitor 14 may be disposed on the insulator substrate 31 in the named order. In this case, the substrate 31 should be transparent.

(2) The hole transporting layer 52 of the organic EL element 13 may be omitted, and the organic compound layers excluding the anode 51 and the cathode 55 may comprise a double-layer structure of the light emitting layer 53 and the electron transporting layer 54. Alternatively, the electron transporting layer 54 of the organic EL element 13 may be omitted, and the organic compound layers excluding the anode 51 and the cathode 55 may comprise a double-layer structure of the hole transporting layer 52 and the light emitting layer 53.

(3) In the organic EL element 13, the hole transporting layer 52 may be designed as a double-layer structure comprising of a first hole transporting layer and a second hole transporting layer. This design can provide the organic EL element 13 which has a very high light emitting efficiency, and further improves the luminance of the organic EL display apparatus.

(4) The MIM diode 16 may replaced with any diode type pixel driving elements such as ZnO (Zinc Oxide) varistor, MSI (Metal Semi-Insulator) diode, BTB (Back to Back) diode and RD (Ring Diode).

(5) The color of light emitted by the organic EL element 13 varies depending on the property of the organic compound that forms the light emitting layer 53. It is preferable that Bebq2 (10-benzo[h]quinolinol-beryllium complex) is used for the emission of green light, OXD (oxadiazole) or AZM (azomethane-zinc complex) for the emission of blue light, PYR (pyrazoline) for the emission of blue green light, Znq2 (8-quinolinol-zinc complex) for the emission of yellow light, and ZnPr (porphyrin-zinc complex) for the emission of red light.

(6) Further, the present invention may be adapted to a display apparatus which uses inorganic EL elements.

Therefore, the present examples and embodiments are to be considered as illustrative and not restrictive and the invention is not to be limited to the details given herein, but may be modified within the scope and equivalence of the appended claims.

What is claimed is:

1. display apparatus of an active matrix system, comprising:
    a plurality of electroluminescence elements;
    a plurality of diodes for driving the respective ones of electroluminescence elements; and
    a plurality of added capacitors, the added capacitors being connected in parallel to the respective ones of the eleroluminesence elements.

2. The display apparatus according to claim 1, further comprising a matrix of pixels each having one of the electroluminescence elements, one of the added capacitors and one of the diodes, each of the electroluminescence elements being connected in series to each of the diodes.

3. The display apparatus according to claim 1, further comprising a plurality of added resistors connected in series to the respective ones of the added capacitors, each of the added resistors and each of the added capacitors being connected in parallel to a respective electroluminescence element.

4. The display apparatus according to claim 3, wherein each of the diodes includes:
    an anode electrode;
    a cathode electrode; and
    an insulator film located between the anode and cathode electrodes, wherein a part of the cathode electrode is used to form one of the added resistors.

5. The display apparatus according to claim 1, wherein each of the electroluminescence elements and each of the added capacitors are laminated on opposing sides of an insulator film.

6. The display apparatus according to claim 1, further comprising a substrate on which the added capacitors are disposed, wherein the electroluminescence elements are disposed on the added capacitors, respectively.

7. The display apparatus according to claim 5, wherein each of the electroluminescence elements includes:
    a first electrode;
    a second electrode; and a light emitting element layer located between the first and second electrodes.

8. The display apparatus according to claim 7, wherein the light emitting element layer includes an organic compound.

9. The display apparatus according to claim 8, wherein the light emitting element layer includes:
   a light emitting layer; and
   at least one of a hole transporting layer and an electron transporting layer.

10. The display apparatus according to claim 8, wherein each of the electroluminescence elements further includes a hole transporting layer having a double-layer structure of a first hole transporting layer and a second hole transporting layer.

11. The display apparatus according to claim 1, wherein each of the diodes is at least one of an MIM (Metal Insulator Metal) diode, a zinc oxide variator, an MSI (Metal Semi-Insulator) diode, a BTB (Back To Back) diode and an RD (Ring Biode).

12. The display apparatus according to claim 1, wherein, when the display apparatus is switched off, each of the plurality of electroluminescence elements is powered by means of the capacitor connected in parallel to each electroluminescence element.

13. In an active matrix system, a plurality of pixels of a display apparatus, each pixel comprising:
   an electroluminescence (EL) element;
   a diode connected in series to the EL element for driving the EL element;
   an added capacitor; and
   an added resistor connected in series with the added capacitor, wherein the added resistor and the added capacitor are connected in parallel to the EL element.

14. The pixel according to claim 13, wherein the diode includes:
   an anode electrode;
   a cathode electrode; and
   an insulator film located between the anode and cathode electrodes, wherein a part of the cathode electrode is used to form the added resistor.

15. The pixel according to claim 14, further comprising a substrate on which the added capacitor is arranged, the electroluminescence element being arranged over the added capacitor via an insulator film.

16. The pixel according to claim 13, wherein the electroluminescence element includes:
   a first electrode;
   a second electrode; and
   a light emitting element layer located between the first and second electrodes.

17. The pixel according to claim 16, wherein the light emitting element layer includes an organic compound.

18. The pixel according to claim 17, wherein the light emitting element layer includes:
   a light emitting layer; and
   at least one of a hole transporting layer and an electron transporting layer.

19. The pixel according to claim 18 wherein the electroluminescence element further includes a hole transporting layer having a double-layer structure of a first hole transporting layer and a second hole transporting layer.

20. The pixel according to claim 19, wherein the diode is at least one of an MIM (Metal Insulator Metal) diode, a zinc oxide variator, an MSI (Metal Semi-Insulator) diode, a BTB (Back To Back) diode and an RD (Ring Diode).

21. The pixel according to claim 13, wherein, when the active matrix system is switched off, each of the EL elements is powered by means of the added capacitor and added resistor in each pixel.

22. The pixel according to claim 13, wherein the added capacitor and added resistor in each pixel are different from the added capacitor and added resistor in at least one other pixel.

* * * * *